US005253179A

United States Patent [19]

Rickett

[11] Patent Number: 5,253,179

[45] Date of Patent: Oct. 12, 1993

[54] COMPENSATION FOR LINE FREQUENCY VARIATION

[75] Inventor: Barry Rickett, Webster, N.Y.

[73] Assignee: Xerox Corporation, Stamford, Conn.

[21] Appl. No.: 632,969

[22] Filed: Dec. 24, 1990

[51] Int. Cl.[5] ............ H03K 5/19

[52] U.S. Cl. ............ 364/484; 355/207

[58] Field of Search ............ 364/484, 487, 174, 166, 364/569; 355/207, 208; 328/138

[56] References Cited

U.S. PATENT DOCUMENTS

| | | | |
|---|---|---|---|
| 4,420,809 | 12/1983 | Pierce | 364/484 |
| 4,601,568 | 7/1986 | Takano et al. | 355/8 |
| 4,914,680 | 4/1990 | Tanno et al. | 328/138 |
| 4,993,052 | 2/1991 | Hammelsbacher | 328/138 |
| 5,107,523 | 4/1992 | Heaney et al. | 328/138 |

OTHER PUBLICATIONS

Barry Rickett, "Method of Eliminating Magnification Errors", Xerox Disclosure Journal, vol. 14, No. 5, Sep.-/Oct. 1989, pp. 249-250.

*Primary Examiner*—Jack B. Harvey
*Assistant Examiner*—Ellis B. Ramirez
*Attorney, Agent, or Firm*—Finnegan, Henderson, Farabow, Garrett & Dunner

[57] ABSTRACT

A method and apparatus for compensating for variations in input line frequency from the nominal line frequency. The method and apparatus utilize the difference between the number of zero crossings at the input line frequency and at the nominal frequency for a predetermined period of time to compensate for any variation in the input line frequency in order to synchronize timing related events.

11 Claims, 2 Drawing Sheets

COMPENSATION FOR LINE FREQUENCY VARIATION

BACKGROUND OF THE INVENTION

The present invention relates to a method for compensating changes in input power line frequency which affect the synchronization of timing related events in a synchronous AC drive system of a copy machine.

DESCRIPTION OF THE RELATED ART

Timing related events in a machine are adversely affected by deviations of the input line frequency from the nominal line frequency because such deviations cause the timing related events to be triggered erroneously and to not be synchronized. In a copy machine, timing related events include the detection of a paper jam. In order to detect a paper jam, the leading edge and the trailing edge of the document paper must be detected. This detection necessitates accurate timing measurements of the paper location.

Another timing related event in a copy machine is an operation sequence to insure that heading and trailing portions of a copy paper, for example, a quarter of an inch at each end of the paper, does not get developed. In order to insure that these outer edges of the copy paper remain blank (undeveloped), an exposure light is turned on at the proper time. The timing must be accurately synchronized so that this light will illuminate only the top and bottom edges of the paper.

Yet another timing related event is the registration of images on document paper. For example, in letterhead forms, it is often necessary that images be registered in very specific places on the paper. Thus, in such forms, the paper must be accurately situated with respect to where the image is to be placed. Accordingly, the paper must be in the proper place at the correct timing.

Timing related events further include events that are triggered at "real" or clock time. For instance, an internal clock in the machine may provide "real" time of day information as a display, or a timer may be provided to turn the machine on and off at specific "real" times.

Although variations in the input line frequency in the U.S. and in other developed countries are normally not large enough to cause a problem, input line frequency variations do pose a real and serious problem in countries where power service is less reliable. The problems arising from input line frequency variation are often serious enough to preclude operation of the system without some method of correction.

A conventional method of correction for variations in input line frequency from the nominal line frequency, resulting in a lack of synchronization, uses windows to make measurements of paper size and to check for paper jams. In geographical areas where the input line frequency is maintained fairly close to the nominal line frequency, the conventional windows have often provided an adequate solution to the problem of input line frequency variations. However, if the excursions of the input line frequency from the nominal line frequency are too great, errors occur when the conventional windows are used, thereby rendering the machine inoperative.

Additionally, in the conventional systems, problems arising from input line frequency variations have also been obviated by employing only DC drive motors in the machine. However, the incremental cost for each machine using only DC motors, with the associated power supplies and controls, is very significant. Thus, the increased cost of using only DC drive motors is an expensive solution to the problem of variations in the input line frequency.

Further, input line frequency variations, as they relate to timing related events, have been compensated for in conventional machines by adding a special software control module to the control systems of the affected machines. However, this conventional method of input line frequency variation compensation requires individual servicing of each system in order to accurately reflect its particular variation in input line frequency from the nominal. This approach is extremely costly, very limited in application, time consuming to implement, and, therefore, not practical.

Thus, a major drawback of the conventional methods of compensation for variations in input line frequency is the inability to correct for input line frequency variations in order to avoid errors in timing related events of the machine.

Accordingly, an object of the present invention is to correct for errors in the execution of timing related events caused by variations in the input line frequency.

Another object of the present invention is to provide a method for correcting for input line frequency variations where the acceptable deviation from the nominal line frequency may be set by the user to enable the system to function at any input line frequency at which an AC motor will function.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

SUMMARY OF THE INVENTION

To achieve the objects in accordance with the purposes of the present invention, as is embodied and described herein, the invention comprises a method of compensation for line frequency variations in a synchronous AC driven system comprising the steps of setting a timer with a predetermined time, counting the number of zero crossings of the line frequency for the predetermined time, calculating the difference between the number of zero crossings and a predetermined constant, and using the calculated difference to control the synchronization of timing related events of the system.

The present invention further comprises a system for compensation of input line frequency variations comprising means for outputting a clock signal at a predetermined frequency based on the input line frequency of the system, a frequency divider connected to the clock for dividing the predetermined frequency by a predetermined divider value, a timer/counter connected to the frequency divider for outputting an interrupt signal at a predetermined time interval corresponding to a frequency based on the divider value of the frequency divider, and means for modifying the predetermined divider value based on the deviation of the input line frequency from the nominal line frequency.

BRIEF DESCRIPTION OF THE DRAWINGS

The accompanying drawings, which are incorporated in and constitute a part of this specification illustrate embodiment(s) of the invention and, together with the description, serve to explain the objects, advantages and principles of the invention. In the drawings.

DESCRIPTION OF THE PREFERRED EMBODIMENTS

The technique and apparatus of the present invention correct for problems associated with synchronous AC motor velocity differentials that occur as a result of input line frequencies that are other than nominal. By this correction, the present invention ensures that timing related events in the machine, such as those described herein, are maintained within acceptable limits even when there are variations in the input line frequency from the nominal line frequency.

Reference will now be made in detail to the present preferred embodiments of the invention, examples of which are illustrated in the accompanying drawings.

Figure 1:
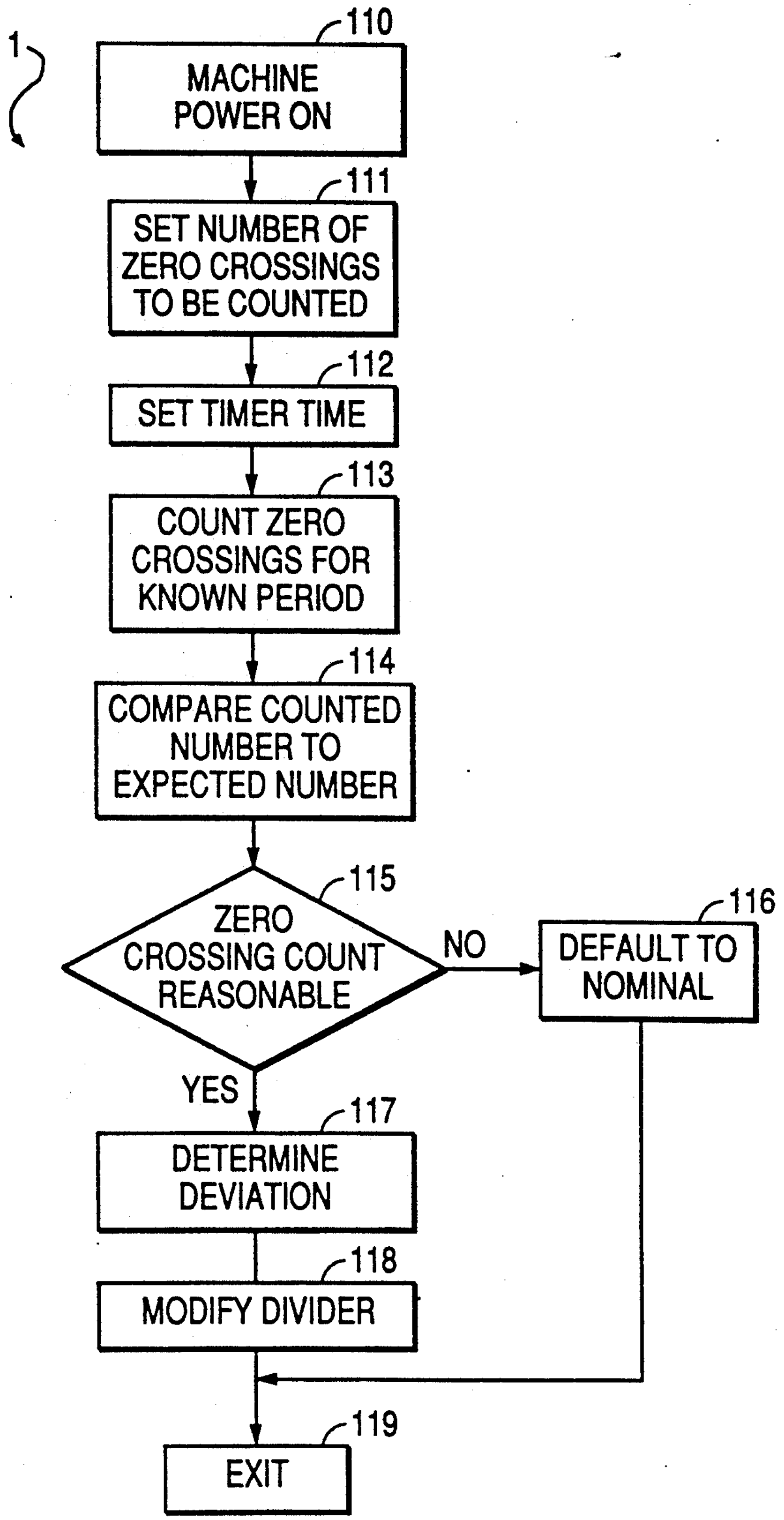
FIG. 1 is a flow chart illustrating a method for input line frequency variation compensation of the present invention.

FIG. 1 illustrates a flowchart of the method of compensation in line frequency according to the present invention. In accordance with the present invention, a copy machine, or the like, is first powered on, as shown in step 110 of the flowchart of FIG. 1.

After the machine is powered on, the actual value of the input line frequency is determined. The accuracy of the measurement of the input line frequency is critical in the present invention because synchronization of the timing related events of the machine is implemented on the basis of the actual value of the input line frequency. The actual value of the input line frequency is determined by counting the number of zero crossings for a predetermined period of time.

Each occurrence of the AC line voltage passing through zero volts is a zero crossing. If the line frequency is nominal, 120 zero crossings are counted every second for a 60 Hz line, and 100 zero crossings are counted every second for a 50 Hz line. In order to measure the input line frequency, a desired number of zero crossings are counted.

The desired number of zero crossings to be counted is both chosen and modifiable by the user, in step 111 of FIG. 1. The accuracy of the measurement of input line frequency variations from the nominal line frequency is determined by the number of zero crossings which are counted. The larger the number of zero crossings are counted in order to determine the actual line frequency, the better the accuracy of the measurement of the deviation of the input line frequency from the nominal frequency. For example, 1024 may be used as the number of zero crossings to be counted because it is a convenient number for manipulation in a microprocessor-based controller 2. By counting this number of zero crossings, the accuracy of the variation of the input line frequency from the nominal line frequency may be determined to within 1/1024.

If the number of zero crossings to be counted is increased by the user in step 111, then smaller variations in the input line frequency from the nominal line frequency may be detected. However, counting a greater number of zero crossings will take a longer period of time. Therefore, compensation for input line frequency variations by the frequency correction method of FIG. 1 will take longer. Moreover, the machine will not operate until the frequency correction routine is completed. Accordingly, in the present invention, the user determines the appropriate number of zero crossings to be counted based on the accuracy of the compensation for input line frequency variation desired, and the time which is allowed for the correction algorithm to run.

The amount of time required to count a specified number of zero crossings at the nominal line frequency is known. For example, in a 60 Hz machine, operating at the nominal line frequency, 1024 zero crossings are expected in 8.53 seconds. In a 50 Hz machine, 1024 zero crossings are expected every 10.24 seconds when the machine operates at the nominal line frequency. Accordingly, a timer is set in step 111 with the time it will take to count the number of zero crossings selected in step 111 at the nominal line frequency.

In step 113, the number of zero crossings at the actual input line frequency is counted for the time period set in step 112. The result of the count is compared with the expected number of zero crossings in step 114 of FIG. 1. The difference between the measured line frequency, expressed as the number of measured zero crossings, and the nominally expected line frequency, expressed as the predetermined number of zero crossings set by the user in step 111, provides the information needed to make proper adjustments to correct for input line frequency variation induced problems. Accordingly, this difference can be used to correct errors arising in the synchronization of timing related events as a result of input line frequency variations.

Before correction for errors caused by variations in the input line frequency is performed, the result obtained by the calculation of the difference between the expected number of zero crossings and the measured number of zero crossings in step 114 is checked to see if it is reasonable, in step 115. If the difference between the number of zero crossings which would be obtained at the nominal line frequency, i.e., the number of zero crossings selected by the user in step 111, and the number of measured zero crossings, found in step 113, at the input line frequency, indicates that the input line frequency deviates by more than, for example, 20% from the nominal line frequency, it is assumed that an error has occurred in the measurement of the number of zero crossings at the input line frequency.

In this instance, assuming that an error has occurred in the count of the zero crossings, the count check performed in step 115 determines that the number of zero crossings is not reasonable, and defaults in step 116 to the number of zero crossings chosen by the user, in step 111. The default in step 116 has the affect of performing n correction for variations in the input line frequency. If an error has not occurred in the zero crossing count and the input line frequency in fact deviates by more than 20% from the nominal line frequency, the AC motors of the machine will not operate.

If it is determined in step 116 that the zero crossing count is reasonable, then the amount and direction of the deviation of the input line frequency from the nominal line frequency is determined in step 117 of FIG. 1. The deviation amount found in step 117 is applied to the timing related events of the machine. The deviation amount, i.e., the difference between the measured and expected zero crossing counts, is used to modify a crystal frequency divider of the machine, in step 118 of FIG. 1. Once the frequency correction routine is completed, it exits at step 119.

Figure 2:
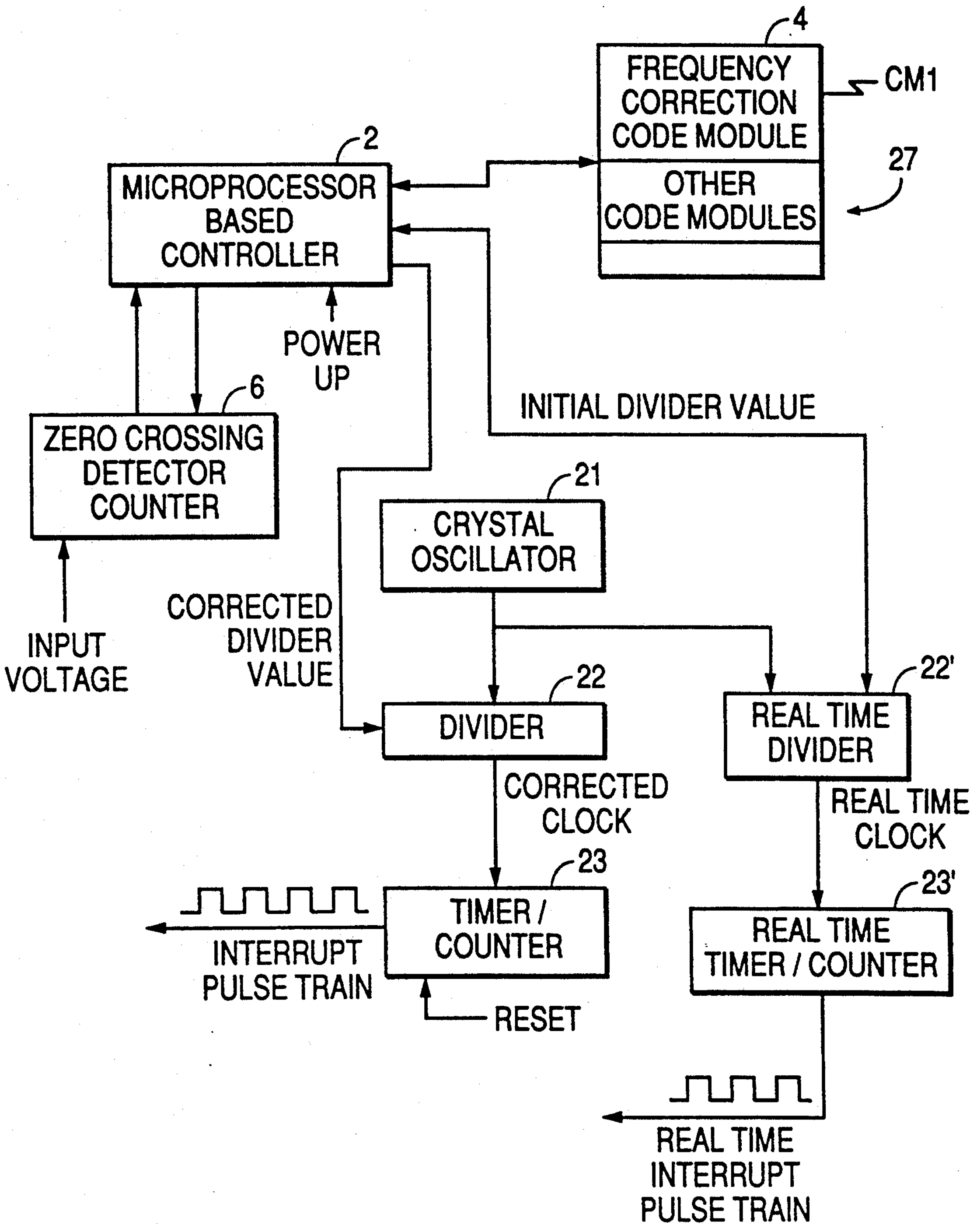
FIG. 2 is a block diagram of a system for performing the method shown in FIG. 1.

The results of the comparison between the expected number of zero crossings at the nominal line frequency, and the measured number of zero crossings at the input line frequency, found by the code module for frequency correction routine 1 of FIG. 1, are utilized by the machine microprocessor-based controller 2, as illustrated in FIG. 2.

Code module CM1, which performs the frequency correction routine illustrated in FIG. 1, is stored in a memory 4 connected to the microprocessor-based controller 2. When the microprocessor-based controller 2 determines that the machine is being powered up in step 111 of FIG. 1, the code module CM1 for the frequency correction routine is read from memory 4. The steps which perform the input line frequency deviation determination method outlined above, and shown in FIG. 1, are included in the code module CM1 performed by the microprocessor-based controller 2 and the results are implemented in microprocessor-based controller 2.

The signal from a crystal oscillator 21 is used to control two types of machine operations. The first type of operations are those which occur in "real time." Examples of "real time" events are how often the control panel buttons are checked, for example, approximately every 10 ms, and how long to wait before activating the power saver mode, for example, somewhere between 15 and 480 minutes. "Real time" events are those which are based on actual clock time.

Other events controlled by crystal oscillator 21 in the microprocessor-based controller 2 are measurement (timing related) events. For instance, if the length of a sheet of paper is known, the length of time it takes for the paper to travel a certain distance would also be known if the paper travels at a known velocity. Therefore, diagnostic and preventive action may be taken if the paper does not travel the distance in the expected length of time. This is an example of paper path jam checking. Another example of a timing related event controlled by the output signal from crystal oscillator 21 is the measurement of the size of a document paper fed from, for example, a bypass tray. If the velocity of the paper is known, and the amount of time the paper is under a sensor is measured, then the length of the paper can be determined.

Synchronization of the timing related events is controlled by the microprocessor-based controller 2 through performance of the frequency correction code module CM1 stored in memory 4. The microprocessor-based controller 2 receives a count from a zero crossing detector and counter 6 which counts the number of zero crossings of the input line voltage as a result of step 113 of the frequency correction routine 1, illustrated in FIG. 1. Timer/counter 23 controls the synchronization of the timing related events in the machine. Timer/counter 23 is loaded, i.e., initialized, with a predetermined counter value. The counter value is decremented at the 500 KHz frequency signal from frequency divider 22, and when the count reaches zero, an interrupt signal is outputted from timer/counter 23. Timer/counter 23 is then reloaded and the process is repeated. An interrupt pulse train is accordingly outputted from timer/counter 23.

With a counter value of 1250, for example, at a frequency of 500 KHz, a square wave interrupt pulse is outputted from timer/counter 23 every 2.5 ms. The output interrupt pulse train from timer/counter 23 controls the timing related events within the machine. Because an output interrupt pulse is outputted from timer/counter 23 every 2.5 ms at the nominal line frequency, the timing related events are controlled by the microprocessor-based controller 2 at time intervals that are equal to 2.5 ms or are multiples of 2.5 ms.

As described above, the microprocessor-based controller 2 generates a corrected divider value as a result of the execution of code module CM1. The corrected value is intended to correct for variations in the frequency of the input line voltage. The microprocessor-based controller 2 provides the corrected divider value as an input to divider 22. Divider 22 receives as another input the output of crystal oscillator 21 which may have a frequency of, for example, 12 MHz. The output of frequency divider 22 is a corrected clock signal compensated for variations in the frequency of the input line voltage. The corrected clock signal drives timer/counter 23, which outputs an interrupt pulse train having a frequency that may deviate from a pulse train corresponding to nominal line frequency in accordance with the variations of the frequency of the input line voltage from the nominal frequency.

As explained above with regard to FIG. 1, the "real time" timing related events are not compensated for variations in input line frequency. A real time divider 22', also connected to crystal oscillator 21, receives the initial divider value as inputted for the particular system. The real time divider 22' provides a real time clock signal to a real time timer/counter 23'. Real time timer/counter 23' outputs a real time interrupt pulse train that may be used to drive devices that are not affected by variations in the frequency of the input line voltage. For example, the real time interrupt pulse train may be used to drive a display that displays the time of day or a timer intended to turn the system on or off at specific times.

At the beginning of the correction sequence, divider 22 is loaded with a known value that will cause timer/counter 23 to output an interrupt signal at exactly 2.5 ms. After divider 22 is loaded with this known value, the number of zero crossings, as discussed above, and as shown in step 113 of FIG. 1, is counted by the zero crossing detector and counter 6. In accordance with step 113, the microprocessor-based controller 2 compares the number of zero crossings measured to the number of zero crossings expected at the nominal line frequency.

If the number of zero crossings counted by the zero crossing detector and counter 6 is determined to be unreasonable by the microprocessor-based controller 6 (step 115), execution of the code module causes the microprocessor-based controller 2 to load divider 22 with the nominal value of zero crossings selected by the user (step 111). The nominal value of zero crossings is that which would be obtained if the input line frequency was equal to the nominal line frequency. If a default occurs as a result of the comparison (step 115), the divider value which ensures that 2.5 ms interrupts are outputted from timer/counter 23 at the nominal line frequency is inputted as the frequency divider number in divider 22.

If the zero crossing count is determined to be reasonable by the microprocessor-based controller 2 (step 115), the corrected divider value is applied to divider 22 (step 119). The corrected divider value insures that the output interrupt pulse train from the timer/counter 23 is maintained as a properly synchronized output interrupt signal.

The modification of the divider value of divider 22 affects the operation of the non-real time functions of the system as follows. If the input line frequency, as measured by the number of counted zero crossings, is determined to be lower than the nominal input line frequency, the paper drives and other devices within the copy machine will run at a proportionately slower speed. Accordingly, the frequency of interrupts outputted from timer/counter 23 must be decreased so that the time between sequential events in the timing cycle is longer. In order to make the time between interrupts outputted from timer/counter 23 greater, the value of divider 22 must be reduced by an amount proportional to the difference between the number of zero crossings counted at the nominal line frequency and the number of zero crossings counted at the actual input line frequency.

Conversely, if the input line frequency is greater than the nominal line frequency, a shorter time between the interrupts of timer/counter 23, i.e., a higher interrupt frequency, is required, and the value of the frequency divider 22 must be increased. Therefore, the amount of change between sequential interrupts of timer/counter 23 is inversely proportional to the amount of deviation of the input line frequency from the nominal line frequency. The corrected divider value inputted to frequency divider 22 is therefore determined by the formula:

$$C=B-((D-A)(B)/D)$$

where:

A=the measured number of zero crossings counted in a predetermined period of time B=the uncorrected divider value C=the corrected divider value D=the expected number of zero crossings counted in a predetermined period of time.

As shown in FIG. 2, by altering the frequency of the interrupt signal output from timer/counter 23, all timing related events controlled by microprocessor-based controller 2 are properly effected. After the correction at the time of power up of the system, the interrupt signal from the timer/counter 23, as determined by the value of divider 22, is utilized by the machine as other code modules 27 stored in memory 4 are executed. The other code modules 27 of the machine control the operation of the timing related events in the machine.

FIGS. 1 and 2 show compensation for variations in input line frequency from the nominal line frequency being performed when the system is powered up. However, the compensation scheme may be performed whenever desired by the user. For instance, the frequency correction routine 1 can be run at specified time intervals, for example, every 12 hours of continuous system operation or after a certain number of copies, for example 2000, have been made.

Other embodiments of the invention will be apparent to those skilled in the art from consideration of the specification and practice of the invention disclosed herein. It is intended that the specification and examples be considered as exemplary only, with the true scope and spirit of the invention being indicated by the following claims.

What is claimed is:

1. A method of compensating for variations in the line frequency from a nominal line frequency in a synchronous AC driven system comprising the steps of:

setting a timer with a predetermined time;

counting the number of zero crossings of the input line frequency for the predetermined time;

calculating the difference between the number of zero crossings and a predetermined constant representing the expected number of zero crossings at the nominal line frequency; and using the calculated difference to generate a clock signal for synchronizing timing related operations of the system affected if the actual line frequency is different from the nominal line frequency.

2. The method of compensating as recited in claim 1, further comprising the step of generating the clock signal with a predetermined frequency if the calculated difference is greater than a second predetermined constant.

3. The method of compensating as recited in claim 1, further comprising the step of providing a crystal oscillator to output a pulse train, and wherein the step of using the calculated difference includes the substep of modifying the frequency of the pulse train from the crystal oscillator by means of a frequency divider controlled by the calculated difference to generate the clock signal.

4. The method of compensating as recited in claim 1, wherein the system comprises any one of a photocopier, a printer, a device employing a light lens, and a device employing ink jet technology.

5. The method of compensating as recited in claim 1, wherein the step of calculating the difference between the number of zero crossings and the predetermined constant is performed responsive to the powering up of the system.

6. A method of compensating for variations in the line frequency from a nominal line frequency in a synchronous AC driven system comprising the steps of:

setting a timer with a predetermined time;

counting the number of zero crossings of the input line frequency for the predetermined time;

calculating the difference between the number of zero crossings and a predetermined constant representing the expected number of zero crossings at the nominal line frequency;

providing a crystal oscillator to generate a pulse train;

providing a frequency divider for dividing the pulse train from the crystal oscillator by a divisor corresponding to the calculated difference to generate a clock signal for synchronizing timing related operations of the system affected if the actual line frequency is different from the nominal line frequency.

7. A synchronous AC drive system for producing an interrupt pulse train for driving timing related operations in the system wherein the pulse train has a frequency that compensates for variations in input line frequency from a nominal line frequency comprising:

means for outputting a train of clock pulses having a predetermined frequency;

a frequency divider connected to the outputting means for dividing the train of clock pulses by a divider value;

means connected to the frequency divider for outputting an interrupt pulse signal having a frequency determined by said divider value; and means for modifying said divider value based on a deviation of the input line frequency from the nominal line frequency such that the frequency of said interrupt pulse signal is compensated for variations of the input line frequency from the nominal line frequency to maintain in synchrony timing related operations of the system affected if the actual line frequency is different from the nominal line frequency.

8. A synchronous AC drive system as recited in claim 7, further including means for controlling said modifying means to modify said divider value when the system is powered on.

9. A synchronous AC drive system as recited in claim 7, wherein the means for modifying the predetermined divider value comprises:

a timer set with a predetermined time;

means for counting the number of zero crossings of the input line frequency for the predetermined time; and means for calculating the difference between the number of zero crossings and a predetermined constant representing the expected number of zero crossings at the nominal line frequency.

10. A synchronous AC drive system as recited in claim 9, further including means for selecting said divider value depending on the accuracy of the variations in input line frequency from the nominal line frequency which are to be determined.

11. A synchronous AC drive system for producing an interrupt pulse train for driving timing related operations in the system wherein the pulse train has a frequency that compensates for variations in input line frequency from a nominal line frequency comprising:

a crystal oscillator for outputting a train of clock pulses having a predetermined frequency;

a frequency divider connected to the outputting means for dividing the train of clock pulses by a divider value;

a timer/counter connected to the frequency divider for outputting an interrupt pulse signal having a frequency determined by said divider value;

a zero crossing detector for counting the number of zero crossings of the line frequency during a predetermined time period;

memory means for storing a frequency compensating routine; and processor means for accessing and executing said frequency compensating routine to modify said divider value based on the deviation of the zero crossing count for the input line frequency from a count corresponding to the nominal line frequency such that the frequency of said interrupt pulse signal is compensated for variations of the input line frequency from the nominal line frequency to maintain in synchrony timing related operations of the system affected if the actual line frequency is different from the nominal line frequency.

* * * * *